(12) United States Patent
Inoue

(10) Patent No.: US 6,278,097 B2
(45) Date of Patent: Aug. 21, 2001

(54) BURN-IN APPARATUS FOR BURNING-IN MICROWAVE TRANSISTORS

(75) Inventor: Akira Inoue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/735,655

(22) Filed: Dec. 14, 2000

Related U.S. Application Data

(62) Division of application No. 09/148,793, filed on Sep. 4, 1998, now Pat. No. 6,197,602.

(30) Foreign Application Priority Data

May 15, 1998 (JP) .................................... 10-104405

(51) Int. Cl.[7] .............................. H05B 6/80; H05B 6/68; H01L 21/66
(52) U.S. Cl. ......................... 219/679; 219/678; 219/702; 438/57
(58) Field of Search .................................... 219/679, 678, 219/745, 750, 715, 702; 438/14, 17, 57, 466, 676

(56) References Cited

U.S. PATENT DOCUMENTS

| | | | |
|---|---|---|---|
| 4,303,455 | * 12/1981 | Splinter et al. | 438/530 |
| 4,517,026 | * 5/1985 | Inoue | 219/686 |
| 5,519,193 | 5/1996 | Freiermuth et al. | 219/678 |
| 5,905,384 | 5/1999 | Inoue et al. | 324/768 |
| 6,078,035 | * 6/2000 | Chittipeddi et al. | 219/678 |

FOREIGN PATENT DOCUMENTS 60-33066   2/1985   (JP) .

* cited by examiner

*Primary Examiner*—Philip H. Leung
(74) *Attorney, Agent, or Firm*—Leydig, Voit & Mayer, Ltd.

(57) ABSTRACT

A burn-in apparatus for burning in a transistor used in a microwave region including a burn-in frequency signal source for supplying a signal lower in frequency than the operating frequency of the transistor and higher in frequency than the response frequency of impurities in the transistor, an input matching circuit connected between the signal source and an input of the transistor, and an output matching circuit including a load and connected to an output of the transistor.

9 Claims, 7 Drawing Sheets

BURN-IN APPARATUS FOR BURNING-IN MICROWAVE TRANSISTORS

This is a divisional of application Ser. No. 09/148,793, filed on Sep. 4, 1998, U.S. Pat. No. 6,197,602 which is incorporated by reference.

BACKGROUND OF THE INVENTION

1. Field of the Invention

The present invention relates to a method of burning in a semiconductor device used in a microwave region, particularly in a region at a frequency of not less than 1 GHz.

2. Description of the Related Art

While compound semiconductors such as GaAs are used for transistors used in microwave regions (several hundreds of MHz to 100 GHz), particularly in high-frequency region at a frequency of not less than 1 GHz, such compound semiconductors have various energy levels on the surface and inside. Some of these levels experience chronic changes such as diminishing concentrations due to electric stress given to the transistor, and therefore a burn-in process is carried out wherein electric stress is given to the transistor to cause changes beforehand in order to ensure reliability of the transistor.

FIG. 14 is a schematic diagram of a burn-in apparatus of the prior art. In the drawing, reference numeral 1 denotes a transistor, 2 denotes a package, and 3 denotes a matching circuit at the operating frequency. The semiconductor device being burned in is an internally matched FET having a matching circuit incorporated in the package.

Burn-in is carried out, with a predetermined drain voltage being applied to a transistor 1, by amplifying a frequency signal (for example 20 GHz) which is output from a signal source 5 by means of an amplifier 7. The signal is supplied to a gate of the transistor 1 while maintaining this state for a predetermined period of time and monitoring the power of the input and output microwave signal by means of a power monitor 6.

During such a burn-in operation, unless frequency matching is accurately done, a reflected wave is generated due to the parasitic inductance and capacitance of jigs and wirings, thus making it impossible to feed high-frequency signals to the transistor, and consequently it becomes difficult to carry out such matching in high-frequency region not lower than 1 GHz. Also it becomes necessary to fabricate wiring of the matching circuit with a high dimensional accuracy in order to match the impedance. This results in higher cost of the matching circuit itself and higher total cost including peripheral devices such as the amplifier.

Meanwhile the present inventors have found that, while burn-in is carried out with a high-frequency electric stress applied, the effect of burn-in may also be achieved by using a frequency lower than the operating frequency, that the impurities do not respond to frequencies lower than a certain value and are mobilized thus making it impossible to achieve the same burn-in effect as that carried out at the operating frequency.

That is, because impurities have different response frequencies (reciprocal of response speed), the impurities cannot follow the changes in the electric field and move accordingly in the case of burn-in with an alternating electric field of a frequency higher than the response frequency of the impurity level. When the burn-in frequency is set lower than the response frequency, however, the impurities move in a behavior different from that observed during burn-in at the operating frequency where the impurities do not move, thus the desired burn-in effect cannot be achieved.

According to the inventor's knowledge, the frequency at which the impurities at the impurity level begin to move is 100 MHz or lower for semiconductors such as GaAs, and the physical behavior of impurities remains the same whether the frequency is 1 GHz or 100 GHz, if the frequency is higher than 100 MHz.

At a frequency higher than 100 MHz, thermal effects can be prevented because this frequency is sufficiently higher than the transient thermal response frequency of semiconductor which is several megahertz.

Based on the finding described above, it is assumed that a burn-in effect similar to that achieved at the actual operating frequency, for example 18 GHz or 40 GHz, can be obtained by burning in-at a frequency higher than 100 MHz.

Japanese Patent Kokai Publication No. 60-33066 discloses a method of burning in by applying a low-frequency signal (10 MHz or lower) to a gate electrode of a high-frequency transistor. However, because impurities at the impurity level begin to move at a low frequency, such as 10 MHz or lower, it will not be possible to achieve the same burn-in effect as that obtained with the operating frequency (100 MHz to 20 GHz).

SUMMARY OF THE INVENTION

An object of the present invention is to provide a method of producing a semiconductor device having the same burn-in effect as is achieved by burning in at the operating frequency, through burn-in at a frequency lower than the operating frequency of a high-frequency transistor.

The present invention provides a method of burning in semiconductor transistors by supplying a signal of burn-in frequency to the semiconductor transistors used in a microwave region, wherein the burn-in frequency is set lower than the operating frequency of the semiconductor transistor device and is higher than the response frequency of the impurities included at the impurity level.

By employing such a method as described above, the same burn-in effect as is achieved by burning in at the operating frequency can be achieved, even when burn-in is carried out at a frequency lower than the actual operating frequency (microwave region from several hundreds of mega-hertz to 100 GHz).

The burn-in frequency is preferably higher than the transient thermal response frequency of the semiconductor transistor.

This is because, when burned in at a frequency higher than the transient. Thermal response frequency, heat due to transient thermal response is not generated during burn-in process and therefore burn-in condition can be prevented from changing.

The operating frequency is preferably higher than 1 GHz.

This is because it makes it possible to burn in a semiconductor transistor of a high operating frequency at a lower burn-in frequency.

The burn-in frequency is preferably selected from the range from 10 MHz to 1 GHz.

The burn-in frequency is more preferably selected from the range from 100 MHz to 1 GHz.

The semiconductor transistor device may also consist of an input matching circuit for the operating frequency, the semiconductor transistor and an output matching circuit for the operating frequency.

The burn-in operation may also be done by connecting an input/output matching circuit for the burn-in frequency to the semiconductor transistor device.

The semiconductor transistor may also be put in class A operation by using a resistor R for the load of the output matching circuit.

This is because such a method enables it to burn in a semiconductor transistor used in class A operation.

The semiconductor transistor may also be put in class C operation by using a resistor R and an LC parallel circuit which is connected in parallel with the resistor R and resonates at the burn-in frequency for the load of the output matching circuit.

This is because such a method enables it to burn in a semiconductor transistor used in class C operation.

The semiconductor transistor may also be put in class F operation by using a resistor R, a first LC parallel circuit which is connected in parallel with the resistor R and resonates at the burn-in frequency and a second LC parallel circuit which is connected in series between the resistor R and the first LC parallel circuit and the transistor output and resonates at a frequency three times the burn-in frequency, for the load of the output matching circuit.

This is because such a method enables it to burn in a semiconductor transistor used in class F operation.

The present invention also provides a burn-in apparatus for burning in the semiconductor transistor used in microwave region by supplying a signal of burn-in frequency, comprising a burn-in frequency signal source, a semiconductor transistor device with an input connected to the signal source, and a load connected to an output of the semiconductor transistor device, wherein the burn-in frequency is lower than the operating frequency of the semiconductor transistor device and is higher than the response frequenc of impurities included at the impurity level of the semiconductor transistor.

Use of such a burn-in apparatus makes it possible to easily achieve matching at the burn-in frequency.

The semiconductor transistor device preferably incorporates an input matching circuit for the operating frequency, the semiconductor transistor and an output matching circuit for the operating frequency.

The load may also comprise a resistor R to have the semiconductor transistor function in class A operation.

This is because harmonics will not be generated in class A operation, and use of the resistor R makes burn-in possible.

The load may also comprise a resistor R and a LC parallel circuit which is connected to the resistor R in parallel and resonates at the burn-in frequency to have the semiconductor transistor function in class C operation.

This is because generation of harmonics must be taken into consideration in the case of class C operation, and use of the load of such a configuration makes it possible to load the semiconductor transistor.

The load may also comprise a resistor R, a first LC parallel circuit which is connected to the resistor R in parallel and resonates at the burn-in frequency and a second LC parallel circuit which is connected in series between the resistor R and the first LC parallel circuit and the transistor output and resonates at a frequency three times the burn-in frequency, to have the semiconductor transistor function in class F operation.

This is because generation of harmonics must be taken into consideration also in the case of class F operation, and use of the load of such a configuration makes it possible to load the semiconductor transistor.

The semiconductor transistor may also be mounted in a burn-in package with the package incorporating an attenuator circuit mounted therein for attenuating frequencies higher than the burn-in frequency.

This is because use of such a low-cost low-frequency package makes it possible to decrease the package cost and mounting the attenuator circuit in the package makes it possible to prevent oscillation during burn-in process.

The attenuator circuit preferably comprises a CR series circuit.

This is because such a configuration makes it possible to attenuate oscillation during burn-in process most simply and at a low cost.

The load may also be configured to substantially match the actual operation parameters of the semiconductor transistor which are determined by measuring drain voltage and drain current of output signal of the semiconductor transistor.

The semiconductor transistor device may also have an input matching circuit provided at the input side thereof for resistance matching.

The present invention also provides a semiconductor transistor which is burned in by a method of any one of claims 1 to 10.

Burning in by such methods makes it possible to improve the reliability of semiconductor transistors operating at high frequencies.

According to the present invention, as described above, it is made possible to carry out burn-in with a lower frequency while preventing undesirable oscillation, by using a low-frequency package 2 of lower cost with C and R added thereto for attenuating high-frequency components added therein.

Although the high-impedance probe is used instead of a power sensor in this embodiment, electric stress to the transistor may also be determined through calculation of voltage and current because the voltage can be directly measured at a low frequency such as 800 MHz.

While the first to fourth embodiments relate to the burn-in process of FET of operating frequency 18 GHz, burn-in at 800 MHz can be done with the same method for FETs of different operating frequencies such as 40 GHz and 10 GHz.

As will be clear from the foregoing discussion, the burn-in method of the present invention makes it possible to achieve the same burn-in effect as that achieved by burning in at the operating frequency, through burn-in at a burn-in frequency lower than the actual operating frequency in microwave region (several hundreds of mega-hertz to 100 GHz).

This makes it possible to achieve easy matching at the burn-in frequency and reduce the production processes.

It is also made possible to prevent the burn-in conditions from changing, because heat generation due to transient thermal response does not occur during burn-in as the burn-in process is carried out at a frequency higher than the transient thermal response frequency.

The frequency of the high-frequency signal is preferably selected from the range from 10 MHz to 1 GHz, and more preferably selected from the range from 100 MHz to 1 GHz.

By using the burn-in apparatus of the present invention, it is made possible to carry out burn-in with a low-cost apparatus and reduce the production cost.

It is made possible to apply sufficient load to a semiconductor transistor while taking the generation of harmonics into consideration, by using a resistor R for the load when the semiconductor transistor is used in class A operation, by using a resistor R and an LC parallel circuit which is connected in parallel with the resistor R and resonates at the burn-in frequency for the load when the semiconductor transistor is used in class C operation, and by using a resistor R, a first LC parallel circuit which is connected in parallel with the resistor R and resonates at the burn-in frequency and a second LC parallel circuit which is connected in series between the resistor R and the first LC parallel circuit and the transistor output and resonates at a frequency three times the burn-in frequency when the semiconductor transistor is used in class F operation.

By incorporating the semiconductor transistor in a package and providing an attenuation circuit for attenuating components of frequencies higher than the burn-in frequency in the package, it is made possible to reduce the package cost and prevent oscillation from occurring during burn-in.

Also high reliability can be achieved for semiconductor transistors burned in by the method of the present invention.

DESCRIPTION OF THE PREFERRED EMBODIMENTS

Embodiment 1

A first embodiment of the present invention will now be described below with reference to FIGS. 1 to 5.

According to this embodiment, an internally matched GaAs FET operating at 18 GHz in class A or class AB operation (having a matching circuit for 18 GHz incorporated in the package) is burned in.

Figure 1:
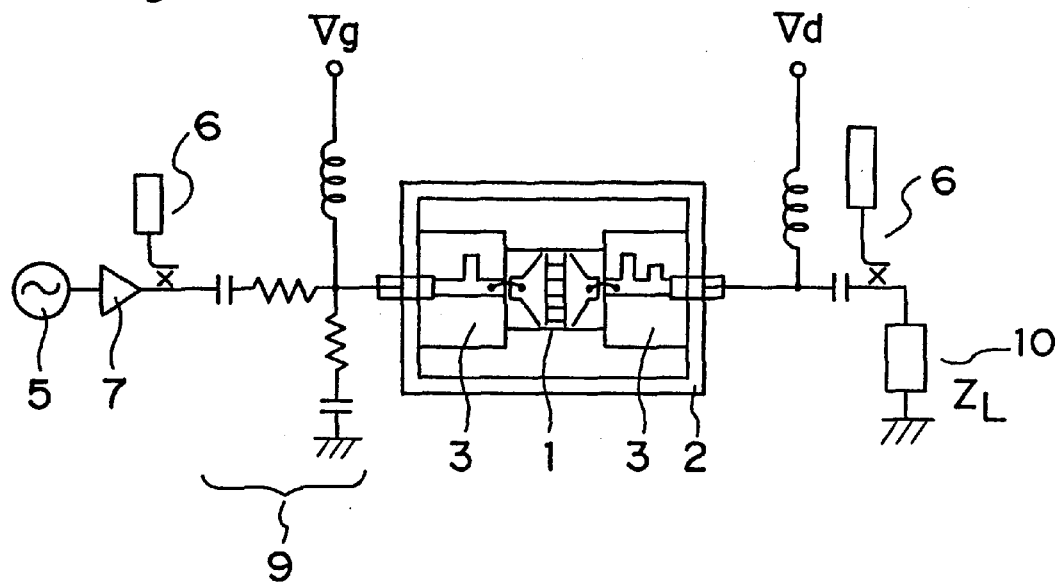
FIG. 1 is a schematic diagram of a burn-in apparatus according to a first embodiment of the present invention.
Figure 14:
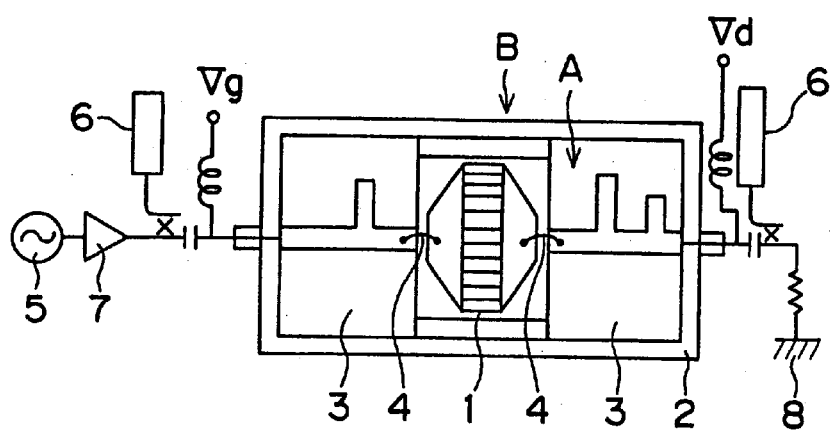
FIG. 14 is a schematic diagram of a burn-in apparatus of the prior art.

FIG. 1 is a schematic diagram showing one channel portion of a burn-in apparatus which burns in a device having an operating frequency of 18 GHz at a burn-in frequency of 800 MHz. In the drawing, reference numerals identical with those used in FIG. 14 denote the same or corresponding portions. Numeral 10 denotes a resistive load, 9 denotes an input side low-frequency matching circuit and 10 denotes an output side low-frequency matching circuit.

In FIG. 1, the semiconductor device to be burned in is an internally matched FET as described above, and therefore a matching circuit 3 for 18 GHz is incorporated in the package 2. However, at a low frequency such as 800 MHz, parasitic capacitance and inductance of the matching circuit 3 may be ignored, and it will suffice to achieve matching by taking only the input matching circuit 9 and the output matching circuit 10, outside of the package 2 into consideration.

As described above, in the burn-in process wherein electric stress is given by applying a high-frequency signal, the impurities cannot follow the changes in the electric field in the case of an alternating electric field changing at a frequency higher than the response frequency of the impurity level while, when the burn-in frequency is set lower than the response frequency, the burn-in effect is changed because the impurities included at the impurity level are moved.

In the case of a GaAs semiconductor transistor, for example, because the response frequency of the highest level is below 100 MHz, although the physical behavior of impurities remains the same even when a frequency of 1 GHz or 100 GHz is applied if higher than 100 MHz, the impurities move when a frequency lower than 100 MHz is applied, resulting in a burn-in effect different from that achieved at the operating frequency of 1 GHz or higher.

At a frequency higher than 100 MHz, sufficiently higher than the transient thermal response frequency which is several megahertz, thermal effect due to the application of the frequency is considered to remain the same. This is because, when burned in at a frequency lower than the transient thermal response frequency, heat is generated during the burn-in process, thus causing the burn-in condition to change.

Thus it is expected that, in the case of a GaAs transistor, a burn-in effect similar to that achieved by using 18 GHz is used can be obtained by burning in at a frequency higher than 100 MHz, which is the response frequency of the highest impurity level, although lower than 18 GHz, the actual operating frequency.

Figure 3:
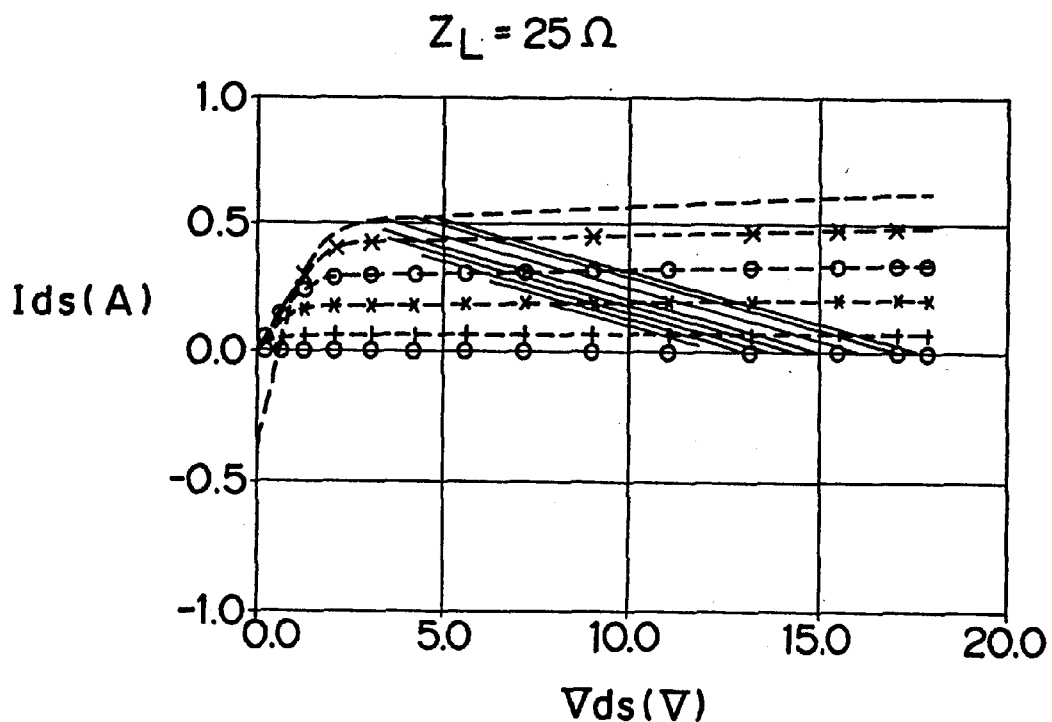
FIG. 3 shows a relationship between Vds and Ids of a transistor used in class A operation.
Figure 4:
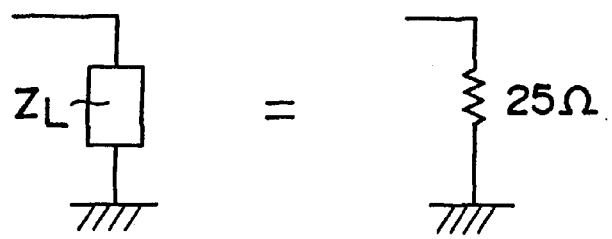
FIG. 4 shows a load resistor used in the first embodiment of the present invention.

FIG. 3 shows a load curve of an internally matched FET used at 18 GHz. The gradient of the load curve shows that the load resistance is 25 $\Omega$. In the case of burn-in at 800 MHz, because parasitic circuit components in the high-frequency matching circuit 3 and in the vicinity of the FET can be ignored, matching can be achieved by using a pure resistance $Z_L$ =25 $\Omega$ (FIG. 4) for the load ($Z_L$) 10.

While FIG. 3 shows plots of calculated values, voltages at the input and output terminals can be easily measured by means of a sampling oscilloscope or the like in the case of a low frequency around 100 MHz, for example, and parasitic circuit components can be ignored, thus it is possible to directly measure the electric field stress applied only to the transistor.

Figure 2:
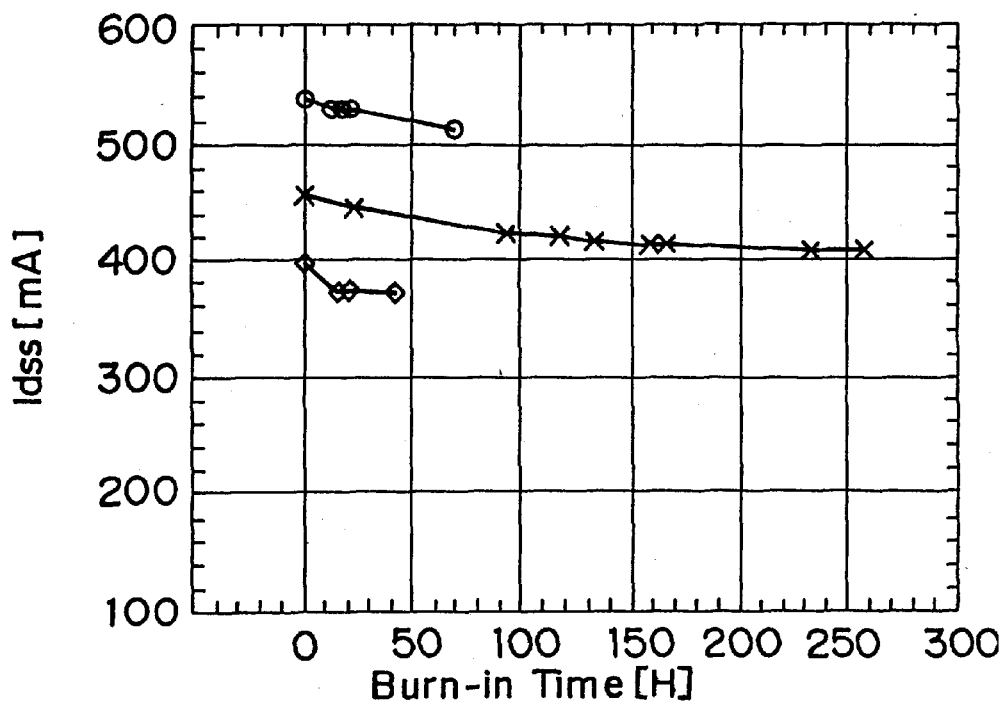
FIG. 2 shows a change in Idss with a lapse of time when burning in by the method of the first embodiment of the present invention.

FIG. 2 shows changes in Idss of samples (an FET which is internally matched for 18 GHz) when burned in at 800 MHz. FIG. 2 shows the results of burning in three kinds of samples, which showed no change in Idss when burned in by applying either heat or DC voltage only, but showed a decrease in Idss after about 48 hours have passed, after the conventional burn-in at 18 GHz.

As shown in FIG. 2, each sample showed a decrease in Idss also after burn-in at 800 MHz according to this embodiment, and plots of the chronic changes show a pattern similar to that of conventional burn-in at 18 GHz. Thus it can be seen that burn-in effect similar to that achieved at 18 GHz is obtained by burning in at 800 MHz. The graph interrupted at a middle point indicates that the sample failed at that point.

In the case of burn-in at 800 MHz, as this frequency is below 1/20 of 18 GHz, costs of the signal source, amplifier, power monitor and jig are lower than that for the conventional burn-in apparatus of 18 GHz (FIG. 14) and the production cost of the semiconductor device can be lowered.

Because burn-in at 800 MHz can be done without matching at 18 GHz, burn-in carried out in a mass production process or the like only for assuring reliability can be done without a difficult operation of matching at a high-frequency, thus making it possible to assure reliability easily in a shorter period of time.

This embodiment is aimed at solving the problems of the conventional burn-in process at the operating frequency (18 GHz) as follows.

Figure 15:
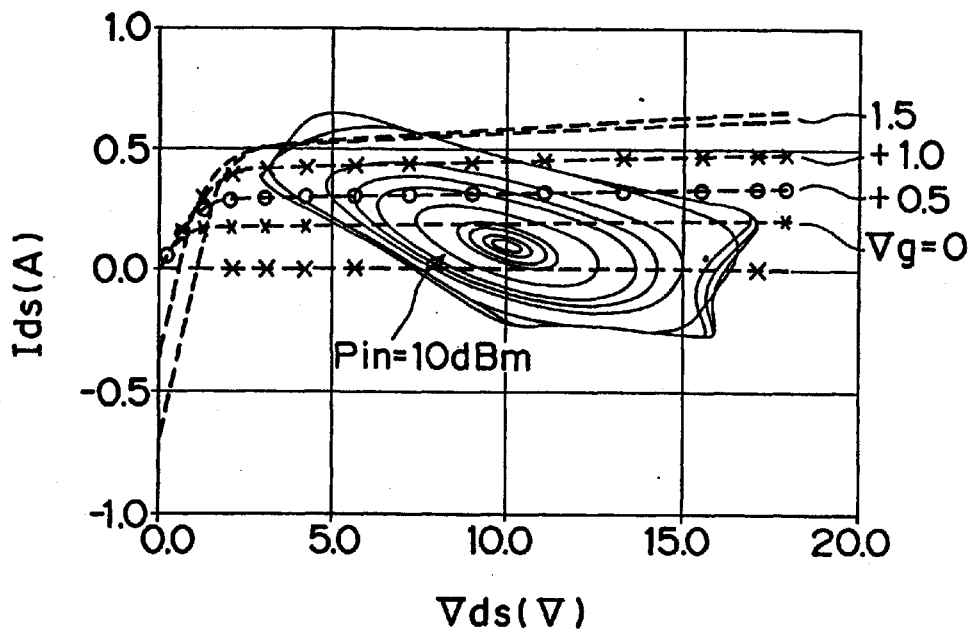
FIG. 15 shows a relationship between Vds and Ids of a high-frequency transistor.
Figure 16:
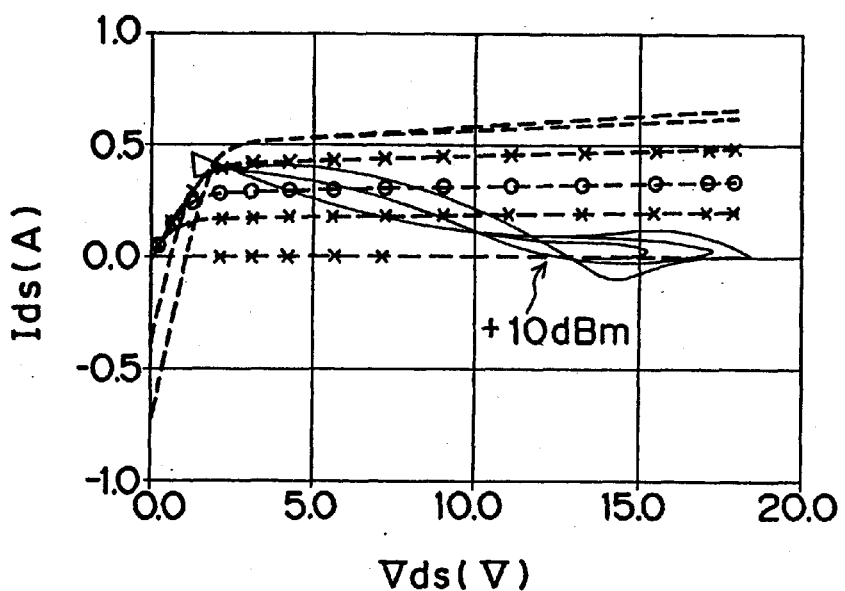
FIG. 16 shows a relationship between Vds and Ids of a high-frequency transistor.

FIG. 15 shows a load curve at 18 GHz calculated for point A of a transistor (output matching circuit end) of the conventional burn-in apparatus (FIG 14) which performs burn-in at the operating frequency (18 GHz). In the drawing, the dashed line indicates the DC characteristics of the transistor at Vg=0 to 1.5 V, together with a load curve when the input voltage $P_{in}$ is changed from −14 to +32 dBm with an increment of 2 dBm.

The load curve deviates from the DC characteristic into a closed loop configuration because of parasitic capacitance and inductance of a wire 4, pad, wiring and the like in the vicinity of the transistor 1, and it is assumed that the load curve would have the relatively linear shape as do the calculated values plotted in FIG. 15 in the transistor (point B of FIG. 1), right below the gate.

In actuality, however, because the load curve cannot be directly measured at a high-frequency region such as 18 GHz, it cannot be known under what conditions of voltage and current the transistor right below the gate is operating. Therefore, the relationship between the electric field stress and the variations in the characteristic is not clear, and it is necessary to determine the burn-in conditions experimentally for each operating frequency and device, taking much time in setting the burn-in conditions.

According to the present invention, because burn-in operation is carried out by using a frequency lower than the operating frequency, the load curve can be directly measured depending on the conditions, and the burn-in conditions can be easily established.

In the case of an FET of class A operation, because the electric field stress (load resistance) is determined from the gradient of the load curve, burn-in can be done by setting the load resistance to a fixed value, without determining the load resistance for each frequency used in burn-in and for the transistor to be burned in.

When the load curve shown in FIG. 3 is obtained as described above, a load resistance of 25 Ω is determined from the gradient of the load curve. Therefore burn-in can be done with simple preset conditions that a 25 Ω resistive load is used for the load ($Z_L$) 10 of FIG. 1 and an AC voltage for an output power of 32 dBm is applied.

This embodiment, because the input matching circuit 9 is of resistive matching type and oscillation is unlikely to occur, has also an advantage that stable burn-in can be carried out even at low frequencies.

That is, although the transistor has a high gain at a low frequency and tends to have unstable input power, matching and stability can be achieved at the same time by means of an input resistor. A loss in the input power which occurs because of not being allotted to the transistor due to the input resistor ratio may be compensated for by increasing the amplifier output, and therefore there is no need for fine tuning of the input matching, thus resulting in easier design and adjustment of the matching.

Embodiment 2

A second embodiment of the present invention will now be described below with reference to FIGS. 5 to 10.

In contrast to the first embodiment wherein an FET used in class A operation is burned in, this embodiment refers to a burn-in process of internally matched GaAs FET used in class C or class F operation at a frequency of 18 GHz.

While class B or class F operation is employed in order to achieve high-efficiency transistor operation, a sufficient load cannot be applied to the FET by simply using a resistor for the load 10, as in the first embodiment. For the transistor used for such a high-efficiency class of operation, it is necessary to take into consideration the effect of harmonics being generated.

Figure 5:
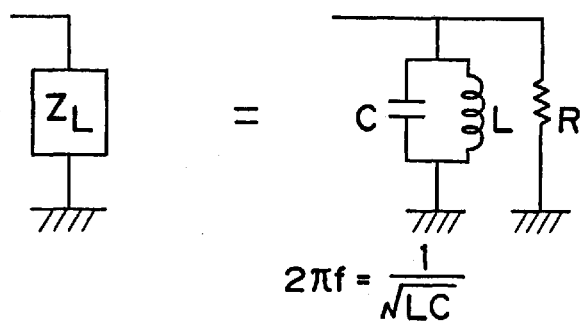
FIG. 5 shows a load resistor used in a second embodiment of the present invention.

FIG. 5 shows a load ($Z_L$) which is matched for high frequency for use in burn-in of an FET designed for class B operation in this embodiment. In the drawing, L and C are parameters which cause resonance at the burn-in frequency (800 MHz), namely that satisfy the relationship $2\pi f=1/\sqrt{(LC)}$. $Z_L$ for the fundamental frequency (800 MHz) is R, and harmonics are all shorted.

Figure 6A:
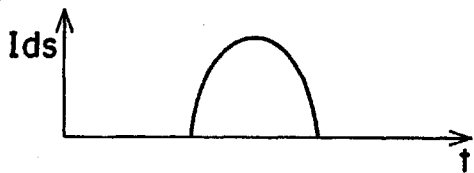
FIGS. 6A and 6B show waveforms of Vds and Ids when an FET is used in class C operation.
Figure 6B:
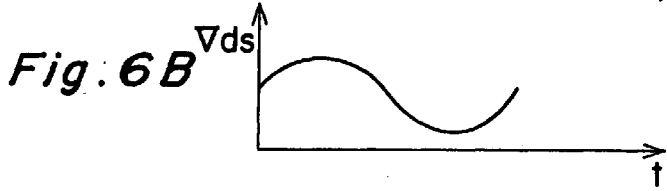
Figure 7:
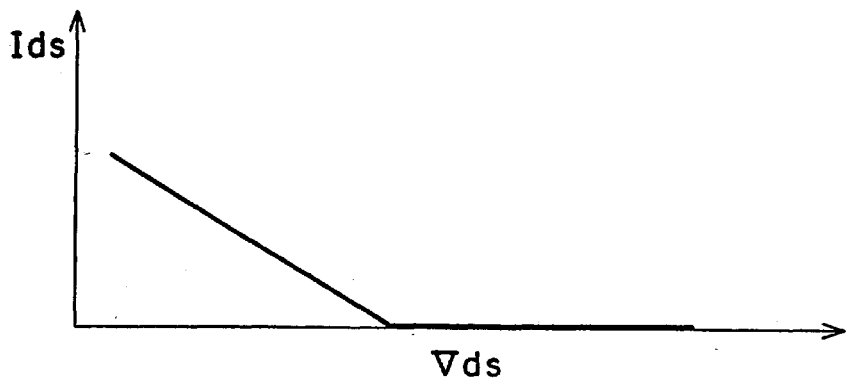
FIG. 7 shows the load curve when the FET is used in class C operation.

FIGS. 6A and 6B show the changes in Vds and Ids during class B operation of the FET. FIG. 7 shows the load curve during class B operation. The load curve shown in FIG. 7 is different from the load curve for class A operation shown in FIG. 3, showing the voltage Vds increasing to a high value at Ids=0. This is because the maximum drain voltage changes due to the existence of the harmonics resulting in a substantial variation of the electric stress in the case of class B operation even when the load for the fundamental frequency is the same.

Consequently, when burning in an FET used in class B operation at a frequency of 18 GHz by using a lower frequency of 800 MHz, it is necessary to achieve matching for the harmonics by using the resonance circuit shown in FIG. 5 for the load 10 of the burn-in apparatus shown in FIG. 1, unlike in the case of class A operation.

Figure 8:
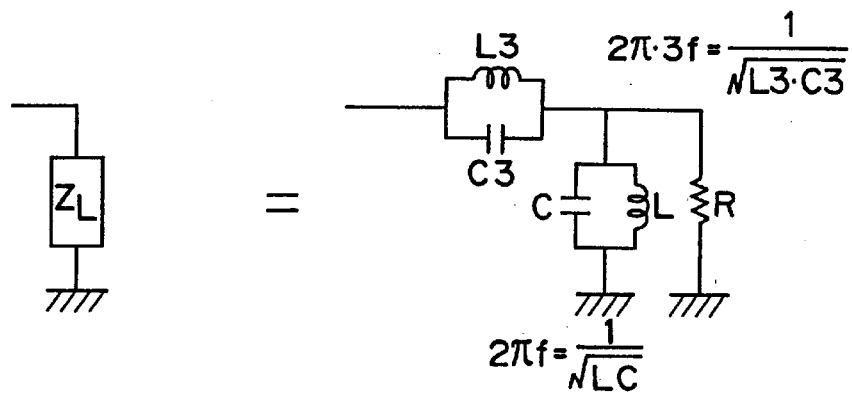
FIG. 8 shows a load resistor used in the second embodiment of the present invention.

FIG. 8 shows the load ($Z_L$) 10 which is matched for high frequency for the use in burn-in of an internally matched GaAs FET designed for class F operation at a frequency of 18 GHz by using a lower frequency of 80 MHz. When burning in an FET used in class F operation, the load shown in FIG. 8 is used instead of the load 10 of the burn-in apparatus shown in FIG 1. This is because harmonics including those having frequencies two times and three times the fundamental frequency (800 MHz) are generated in class F operation, which must be taken into consideration when setting the load.

The load shown in FIG. 8 is designed so that a circuit of L3 and C3 resonates with three times the fundamental frequency (namely satisfies the relationship $2\pi 3f=1/\sqrt{(L3\cdot C3)}$) and a circuit of L and C resonates with the fundamental frequency (namely satisfies the relationship $2\pi f=1/\sqrt{(L\cdot C)}$). That is, the load is matched to be open for a harmonic component three times the fundamental frequency, acts as a resistor R for the fundamental frequency, and is shorted for other harmonics.

Figure 9A:
FIGS. 9A and 9B show waveforms of Vds and Ids when an FET is used in class F operation.
Figure 9B:
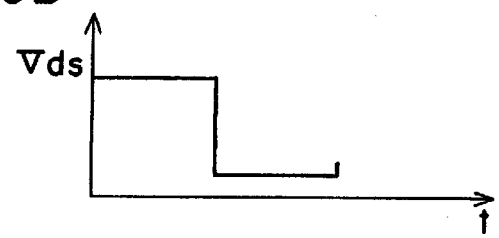
Figure 10:
FIG. 10 shows the load curve when the FET is used in class F operation.

FIGS. 9A and 9B show the changes in Vds and Ids during class F operation of the FET. FIG. 10 shows the load curve during the class F operation.

As will be clear from the load curve, the electric stress cannot be made constant unless matching similar to that for a high frequency is achieved for device used in class F operation, similar to the case of class B operation, even if operated at a lower frequency of 800 MHz.

Consequently, it is necessary to apply a constant electric stress by matching for the harmonics to be generated by using the resonance circuit for the load ($Z_L$), as described above. Then the burn-in effect similar to that achieved at 18 GHz is obtained by using the resonance circuit as the load and burning in at a lower frequency of 800 MHz, thereby making it possible to reduce the production cost.

Embodiment 3

A third embodiment of the present invention will now be described below with reference to FIGS. 11 and 12.

Figure 11:
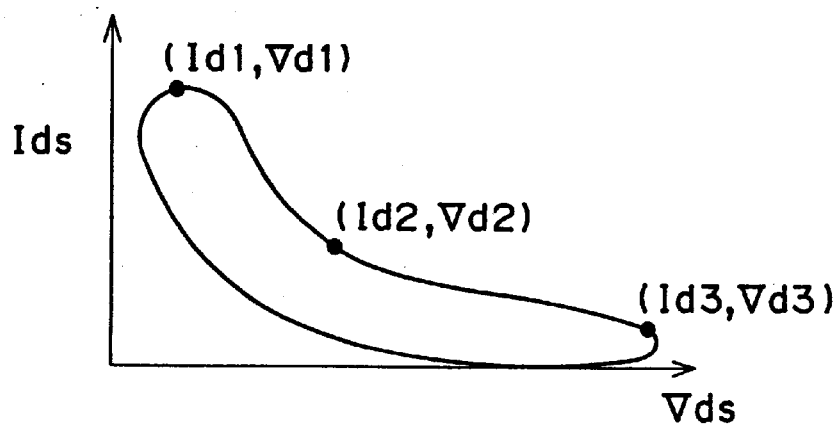
FIG. 11 shows the load curve of the FET.

While the first and the second embodiments relate to the burn-in process of an internally matched GaAs FET used in class A, class C or class F operation, there are others which show complicated load curves as shown in FIG. 11.

In order to burn in such an internally matched GaAs FET, there is a method of low-frequency burn-in at 800 MHz, wherein substantially the same electric stress as that of the operating frequency, 18 GHz, is applied to the transistor by using a virtual load having a characteristic curve that passes through the points (Id1, Vd1), (Id2, Vd2) and (Id3, Vd3) of FIG. 11.

When such a method is used, a burn-in effect similar to that obtained under the conditions of FIG. 11 can be achieved by using a combination of R, L and C for the load (ZL) 10 of the burn-in apparatus shown in FIG. 1. An imaginary load curve determined by the combination passes key points (a point with maximum Vd, a point with maximum Id and a mid point therebetween in FIG. 11) of the actual load curve is used, and burn-in is carried out by using such a load.

It is also possible to carry out burn-in by applying a load that has a greater stress and satisfies relationships Vd>Vd3, Id>Id1 and Vd<Vd1.

Figure 12A:
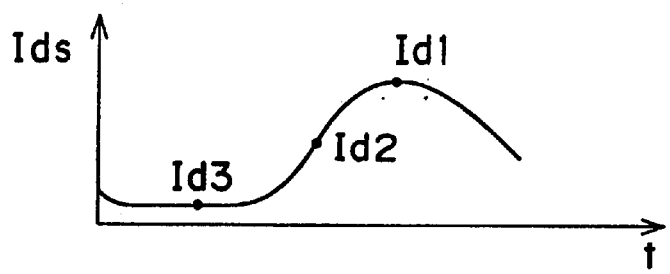
FIGS. 12A, 12B and 12C show a waveform of Vds and Ids of the FET.
Figure 12B:
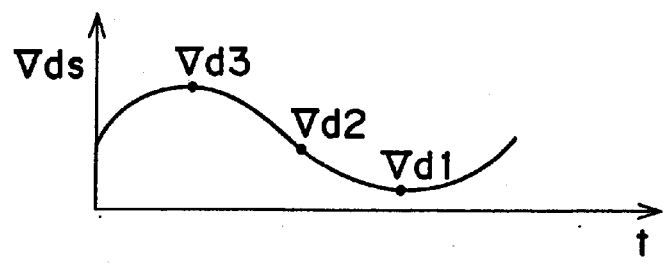
Figure 12C:
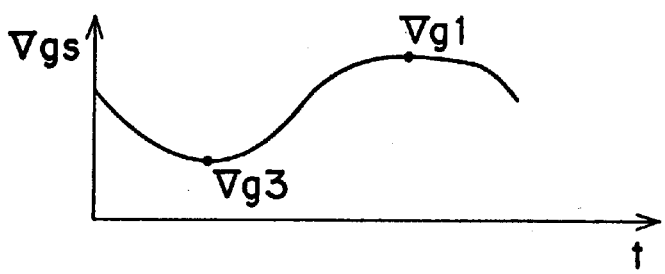

FIGS. 12A, 12B and 12C show the changes of Ids, Vds and Vgs in the case where the load curve shown in FIG. 11 is obtained.

While the electric stress is defined by the drain voltage and drain current in the first and second embodiments, burn-in may also be carried out by using the value Vg, thereby applying an electric field stress between the gate and the drain, apart from burn-in carried out by applying drain voltage, in case the electric field stress between the gate and the drain is dominant in determining the reliability of the transistor.

That is, electric field stress greater than (Vd3−Vg3) can be given between the gate and the drain by setting the input load so that either the load curve passes through Vd3 and Vg3 or Vd>Vd3 and Vg<Vg3 are satisfied as conditions of greater stress. It is preferable to use a resistive load for the input load.

With this configuration, it is made possible to carry out burn-in at a lower frequency such as 800 MHz, instead of the operating frequency of 18 GHz, between the gate and the drain as well, reducing the burn-in cost.

Embodiment 4

While the first to third embodiments relate to the burn-in process of an internally matched GaAs FET having the matching circuit 3 for 18 GHz incorporated in the package 2, the first through the third embodiments may also be applied for burning in only an FET without the internal matching circuit. In the case of a device which is not internally matched, namely does not have a matching circuit, a low-cost package made for use at low frequencies may be used for the sample to be burned in.

Figure 13:
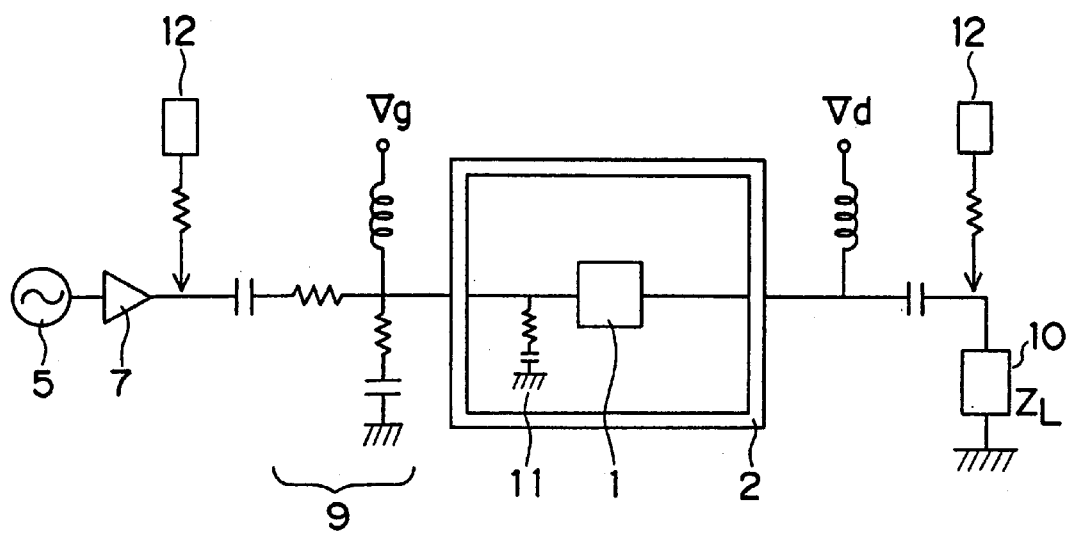
FIG. 13 is a schematic diagram of a burn-in apparatus of the fourth embodiment of the present invention.

FIG. 13 is a schematic diagram of a burn-in apparatus for FETs without internal matching circuit 3. In the drawing, reference numerals identical with those used in FIG. 14 denote the same or corresponding portions. Numeral 11 denotes a CR series circuit, and 12 denotes a high-impedance probe.

When the low-frequency package 2 is used, it is often impossible for high-frequency signals to pass the input/output terminals due to resonance at high frequencies. Because a high-frequency transistor has high gain up to a high-frequency region, high-frequency components which do not pass the input/output terminals are completely reflected at the input/output terminals, often resulting in oscillation in the package.

Therefore this embodiment prevents high-frequency oscillation in the package 2 which occurs even when burning in using a low frequency of 800 MHz, by adding C and R (11 in FIG. 13) for attenuating high-frequency components.

For a frequency of 18 GHz, for example, a sufficiently stable circuit without oscillation can be made by setting R=100 Ω and C=1 pF, but such a circuit has no substantial effect to the burn-in frequency of 800 MHz.

What is claimed is:

1. A burn-in apparatus for burning in a transistor used in a microwave region comprising:
    a burn-in frequency signal source for supplying a signal lower in frequency than the operating frequency of the transistor and higher in frequency than the response frequency of impurities in the transistor,
    an input matching circuit connected between the signal source and an input of the transistor, and
    an output matching circuit comprising a load and connected to an output of the transistor.

2. The apparatus as claimed in claim 1, wherein the transistor incorporates an input matching circuit for the operating frequency and an output matching circuit for the operating frequency.

3. The apparatus as claimed in claim 1, wherein the load comprises a resistor R for operation of the transistor in Class A operation.

4. The apparatus as claimed in claim 1, wherein the load comprises a resistor R and an LC parallel circuit connected in parallel with the resistor R and resonating at the burn-in frequency so the transistor operates in class C operation.

5. The apparatus as claimed in claim 1, wherein the load comprises a resistor R, a first LC parallel circuit connected in parallel with the resistor R and resonating at the burn-in frequency, and a second LC parallel circuit connected in series with and between the resistor R and the first LC parallel circuit and the transistor output and resonating at a frequency three times the burn-in frequency, so the transistor operates in class F operation.

6. The apparatus as claimed in claim 1, including a burn-in package incorporating an attenuator circuit for attenuating frequencies higher than the burn-in frequency.

7. The apparatus as claimed in claim 6, wherein the attenuator circuit comprises a CR series circuit.

8. The apparatus as claimed in claim 1, wherein the load substantially matches the actual operation parameters of the transistor, determined by measuring drain voltage and drain current of the output signal of the transistor.

9. The apparatus as claimed in claim 1, wherein the transistor includes an input matching circuit at an input side for resistance matching.

* * * * *